United States Patent [19]
Okamoto

[11] Patent Number: 6,002,846
[45] Date of Patent: Dec. 14, 1999

[54] PRINTING APPARATUS AND METHOD FOR PROTECTING INFORMATION IN PRINTING APPARATUS

[75] Inventor: Hideaki Okamoto, Machida, Japan

[73] Assignee: Canon Kabushiki Kaisha, Japan

[21] Appl. No.: 09/024,192

[22] Filed: Feb. 17, 1998

[30] Foreign Application Priority Data

Feb. 14, 1997 [JP] Japan ................................. 9-030883
Jan. 21, 1998 [JP] Japan ................................ 10-009770

[51] Int. Cl.⁶ .................................................. G06K 15/00
[52] U.S. Cl. ............................................. 395/115; 395/113
[58] Field of Search ..................................... 395/101, 112,
395/113, 115, 116; 399/9, 10, 12, 37; 358/444;
400/50, 54, 6; 345/507, 508, 511

[56] References Cited

U.S. PATENT DOCUMENTS

| | | | |
|---|---|---|---|
| 4,313,124 | 1/1982 | Hara | 346/140 |
| 4,345,262 | 8/1982 | Shirato et al. | 346/140 |
| 4,459,600 | 7/1984 | Sato et al. | 346/140 |
| 4,463,359 | 7/1984 | Ayata et al. | 346/1.1 |
| 4,558,333 | 12/1985 | Sugitani et al. | 346/140 |
| 4,608,577 | 8/1986 | Hori | 346/140 |
| 4,723,129 | 2/1988 | Endo et al. | 346/1.1 |
| 4,740,796 | 4/1988 | Endo et al. | 346/1.1 |
| 4,942,575 | 7/1990 | Earnshaw et al. | 371/10.1 |
| 5,111,457 | 5/1992 | Rabjohns et al. | 371/10.1 |
| 5,220,645 | 6/1993 | Nakajima | 395/115 |
| 5,594,840 | 1/1997 | Sahay et al. | 395/113 |

FOREIGN PATENT DOCUMENTS

| | | |
|---|---|---|
| 0184613 | 6/1986 | European Pat. Off. . |
| 54-56847 | 5/1979 | Japan . |
| 59-123670 | 7/1984 | Japan . |
| 59-138461 | 8/1984 | Japan . |
| 60-71260 | 4/1985 | Japan . |
| 61-72301 | 4/1986 | Japan . |
| 63-124627 | 5/1988 | Japan . |
| 62230370 | 9/1988 | Japan . |
| 2016759 | 9/1979 | United Kingdom . |

*Primary Examiner*—Arthur G. Evans
*Attorney, Agent, or Firm*—Fitzpatrick, Cella, Harper & Scinto

[57] ABSTRACT

A printing apparatus and a method for protecting information in a printing apparatus capable of performing a normal operation by restoring valid information even if abnormality occurs in a part of information stored in a non-volatile memory, are provided. This apparatus is equipped with electrically programmable and erasable first and second memory means. This apparatus writes predetermined first information, which the printing apparatus should store, and first check data capable of determining integrity of the first information into the first memory means, writes second information constituted by at least a part of the first information and second check data capable of determining integrity of the second information into the second memory means, reads out the first information and the first check data so as to determine the integrity of the first information, reads out the second information and the second check data so as to determine the integrity of the first information, and rewrites the first information stored in the first memory means and/or the second information stored in the second memory means in accordance with the determination result of the integrity of the first and second information.

23 Claims, 5 Drawing Sheets

PRINTING APPARATUS AND METHOD FOR PROTECTING INFORMATION IN PRINTING APPARATUS

BACKGROUND OF THE INVENTION

The present invention relates to a printing apparatus and a method for protecting information in the printing apparatus and, more particularly, to a printing apparatus having a non-volatile memory and a method for protecting information in the printing apparatus.

In a conventional printing apparatus, operation modes for defining its operations, adjustment values for use of a printing apparatus in an optimal state, and printing apparatus maintenance information are occasionally written in a non-volatile memory. These pieces of information are read out, as needed, to perform print and maintenance operations. As a non-volatile memory, an electrically programmable and erasable memory such as an EEPROM is used because it is easy to handle.

When such a non-volatile memory is powered off during a data write operation, the contents of the write data are not ensured and become indefinite data.

A conventional printing apparatus does not presume power-off during data write access to a non-volatile memory. For this reason, even if abnormal data is read out, since it cannot be determined as abnormal, an operation based on the abnormal readout data might be executed, thus undesirably resulting in an operation error.

SUMMARY OF THE INVENTION

Accordingly, it is an object of the present invention to provide a printing apparatus and a method for protecting information in the printing apparatus capable of performing a normal operation by restoring valid information even if abnormality occurs in a part of information stored in a non-volatile memory.

According to one aspect of the present invention, the foregoing object is attained by a printing apparatus for printing on a print medium by a printhead, comprising: electrically programmable and erasable first and second memory means; control means for writing predetermined first information, which the printing apparatus should store, and first check data capable of determining integrity of the first information into the first memory means, and writing second information constituted by at least a part of the first information and second check data capable of determining integrity of the second information into the second memory means; and determination means for reading out the first information and the first check data stored in the first memory means so as to determine the integrity of the first information, and reading out the second information and the second check data stored in the second memory means so as to determine the integrity of the first information, wherein the control means performs updating the first information stored in the first memory means and/or the second information stored in the memory means in accordance with the determination result of the integrity of the first and second information by said determination means.

Note that the first and second memory means are non-volatile memories, respectively, and the first and second memory means are respectively a first area and a second area which are obtained by dividing a storage area of a non-volatile memory.

It is preferable that the above determination means includes comparison means for comparing the first information with the first check data as well as comparing the second information with the second check data, and the determination means determines the integrity of the first and second information based on the comparison result by the comparison means. In this case, the determination means preferably generates first and second reference information used for respectively comparing the first and second check data in accordance with the first and second information, and determines the integrity of the first and second information based on the generated reference data.

Furthermore, it is preferable that the first and second memory means are respectively addressable memories, the first check data is information obtained by adding data stored in each address of the first memory means in which the first information is stored under the condition that the integrity of the first information is ensured, the first reference data to be compared with the first check data is information obtained by adding data stored in each address of the first memory means in which the first information is stored, the second check data is information obtained by adding data stored in each address of the second memory means in which the second information is stored under the condition that the integrity of the second information is ensured, and the second reference data to be compared with the second check data is information obtained by adding data stored in each address of the second memory means in which the second information is stored.

Further note that it is desirable that:

(1) in a case where it is determined by the determination means that neither the integrity of the first information written in the first memory means nor the integrity of the second information written in the second memory means is ensured, the above control means rewrites the first information stored in the first memory means by initial setting information of the printing apparatus, rewrites the second information stored in the second memory means according to the rewritten first information, and updates the first and second check data;

(2) in a case where it is determined by the determination means that the integrity of the first information written in the first memory means is not ensured and the integrity of the second information written in the second memory means is ensured, the control means rewrites the first information stored in said first memory means according to the second information stored in said second memory means and updates the first check data; and (3) in a case where it is determined by the determination means that the integrity of the second information written in the second memory means is not ensured and the integrity of the first information written in the first memory means is ensured, the control means rewrites the second information stored in the second memory means according to the first information stored in the first memory means and updates the second check data.

Also, the control means may cause the determination means to make a determination according to power-on to the printing apparatus, and the control means may perform rewriting operation on the first information stored in the first memory means and/or the second information stored in the second information in accordance with the determination result by the determination means.

Preferably, the printhead is a printhead for discharging ink to perform a print operation according to an ink-jet printing method, and in this case, the printhead comprises an electrothermal transducer for applying heat energy to the ink so as to discharge the ink using the heat energy.

Note that, according to a preferred embodiment, the second information written in the second memory means is information indispensable to holding of accuracy of a print operation of the printing apparatus and maintenance of the printing apparatus, and more specifically, this information includes print density correction data set at the time of shipment from a factory, correction data associated with drive mechanism accuracy of the printing apparatus, a cumulative number of printed paper, a cumulative number of recovery operation, a cumulative number of attaching/detaching of a printhead, a suction ink amount in a recovery operation, and a discharge ink amount in a preliminary discharge operation.

According to another aspect of the present invention, the foregoing object is attained by providing a method of protecting information in a printing apparatus, including electrically programmable and erasable first and second memory means, for printing on a print medium by a printhead, comprising: a first write-in step of writing predetermined first information, which the printing apparatus should store, and first check data capable of determining integrity of the first information into the first memory means; a second write-in step of writing second information constituted by at least a part of the first information and second check data capable of determining integrity of the second information into the second memory means; a determination step of reading out the first information and the first check data stored in the first memory means so as to determine the integrity of the first information, and reading out the second information and the second check data stored in the second memory means so as to determine the integrity of the first information; a rewrite step of rewriting the first information stored in the first memory means and/or the second information stored in the second memory means in accordance with the determination result of the integrity of the first and second information at the determination step.

In accordance with the present invention as described above, in a printing apparatus, including electrically programmable and erasable first and second memory means, for printing on a print medium by a printhead, it is operated such that predetermined first information, which the printing apparatus should store, and first check data capable of determining integrity of the first information is written into the first memory means, second information constituted by at least a part of the first information and second check data capable of determining integrity of the second information is written into the second memory means, the first information and the first check data stored in the first memory means is read out so as to determine the integrity of the first information, the second information and the second check data stored in the second memory means is also read out so as to determine the integrity of the first information, and the first information stored in the first memory means and/or the second information stored in the second memory means is rewritten in accordance with the determination result of the integrity of the first and second information.

The invention is particularly, advantageous since the contents of the first and second memory means, for example, constituted by a non-volatile memory are checked when the printing apparatus is powered on, and processing according to the check results is executed. A printing apparatus operation error due to use of data whose integrity is not ensured can be prevented, and reliability can be further improved.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENT

A preferred embodiment of the present invention will now be described in detail in accordance with the accompanying drawings.

Figure 1:
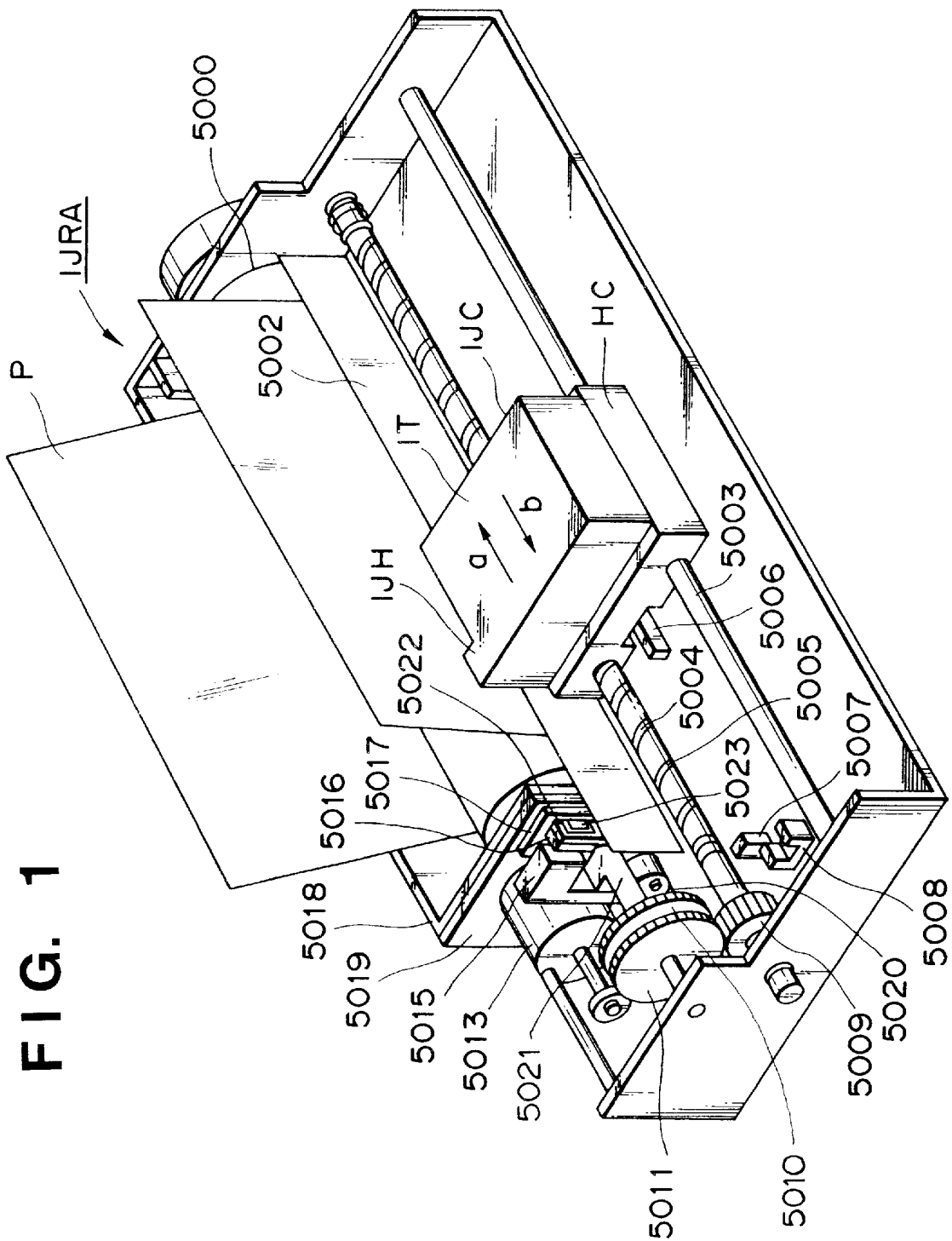
FIG. 1 is a perspective view showing the outer appearance of an ink-jet printer IJRA as a typical embodiment of the present invention.

FIG. 1 is a perspective view showing the outer appearance of an ink-jet printer (hereinafter simply referred to as "printer") IJRA as a typical embodiment of the present invention;

Brief Description of Apparatus Main Unit

FIG. 1 is a perspective view showing the outer appearance of an ink-jet printer IJRA as a typical embodiment of the present invention. Referring to FIG. 1, a carriage HC engages with a spiral groove 5004 of a lead screw 5005, which rotates via driving force transmission gears 5009 to 5011 upon forward/reverse rotation of a driving motor 5013. The carriage HC has a pin (not shown), and is reciprocally scanned in the directions of arrows a and b in FIG. 1. An integrated ink-jet cartridge IJC which incorporates a printing head IJH and an ink tank IT is mounted on the carriage HC. Reference numeral 5002 denotes a sheet pressing plate, which presses a paper sheet against a platen 5000, ranging from one end to the other end of the scanning path of the carriage. Reference numerals 5007 and 5008 denote photocouplers which serve as a home position detector for recognizing the presence of a lever 5006 of the carriage in a corresponding region, and used for switching, e.g., the rotating direction of the motor 5013. Reference numeral 5016 denotes a member for supporting a cap member 5022, which caps the front surface of the printing head IJH; and 5015, a suction device for generating sucking power in the interior of the cap member by generating the sucking power when an area in which orifices for discharging ink in the printhead IJH are formed is capped by the cap member 5022. The suction device 5015 performs suction recovery of the printing head via an opening 5023 of the cap member 5015. Reference numeral 5017 denotes a cleaning blade; 5019, a member which allows the blade to be movable in the back-and-forth direction of the blade. These members are supported on a main unit support plate 5018. The shape of the blade is not limited to this, but a known cleaning blade can be used in this embodiment. Reference numeral 5021 denotes a lever for initiating a suction operation in the suction recovery operation. The lever 5021 moves upon movement of a cam 5020, which engages with the carriage, and receives a driving force from the driving motor via a known transmission mechanism such as clutch switching.

The capping, cleaning, and suction recovery operations are performed at their corresponding positions upon operation of the lead screw 5005 when the carriage reaches the home-position side region. However, the present invention is not limited to this arrangement as long as desired operations are performed at known timings.

Description of Control Configuration

Next, control configuration for performing printing control in the above-described apparatus will be described with reference with FIG. 2.

Figure 2:
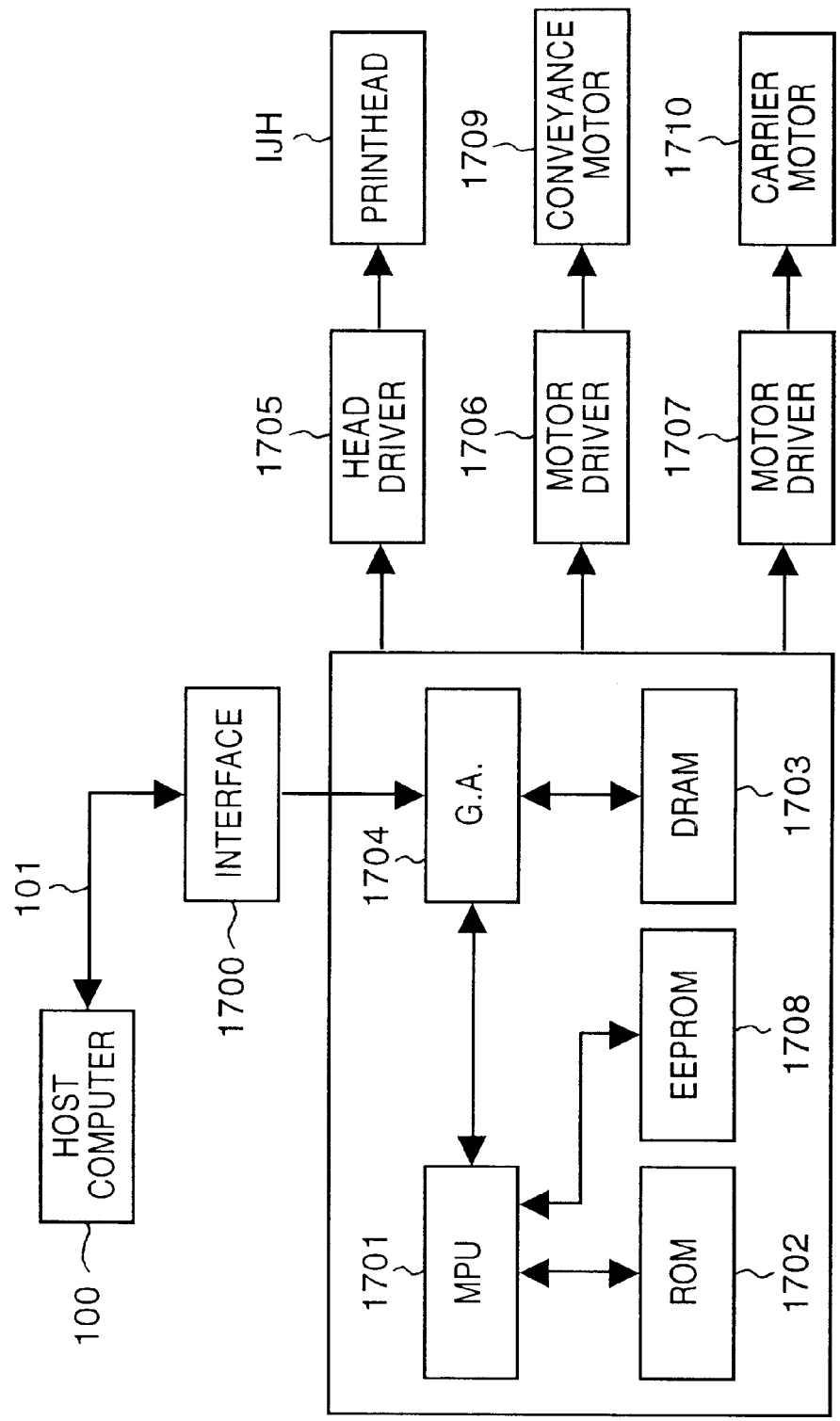
FIG. 2 is a block diagram showing the arrangement of a control circuit of the ink-jet printer IJRA.

FIG. 2 is a block diagram showing the arrangement of a control circuit of the printer IJRA. Referring to FIG. 2 showing the control circuit, reference numeral 100 denotes a host computer (hereinafter simply referred to as "host") for transmitting a print control instruction and printing data to the printer IJRA and receiving a response signal, error information and the like from the printer IJRA so as to display the received information on a screen for a user; 101, a connection cable for connecting the host 100 and the printer IJRA; 1700, an interface for inputting a printing signal from the host 100; 1701, a microprocessor (MPU) for controlling an overall of the printer IJRA; 1702, a ROM for storing a control program executed by the MPU 1701; and 1703, a DRAM for storing various data (the printing data, printing signal supplied to the printing head, and the like).

Reference numeral 1704 denotes a gate array (G.A.) for performing supply control of the printing signal to the printhead IJH. The gate array 1704 also performs data transfer control among the interface 1700, the MPU 1701, and the RAM 1703. Reference numeral 1710 denotes a carrier motor for transferring the printhead IJH; and 1709, a conveyance motor for conveying a printing sheet. Reference numeral 1705 denotes a head driver for driving the printhead IJH; and 1706 and 1707, motor drivers for respectively driving the conveyance motor 1709 and the carrier motor 1710.

Reference numeral 1708 denotes an EEPROM for storing operation modes for defining the printer's operations, adjustment values and setting values for use of the printer IJRA in an optimal state, information required for the printer's maintenance and the like. Various control signals such as chip-select, read-out, write-in and clock other than the above information is sent and transmitted between the EEPROM 1708 and the MPU 1701. Note that a non-volatile memory other than an EEPROM may be used.

The operation of the above control arrangement will be described below. When a printing data is input to the interface 1700, the printing data is converted into printing signal for a printing operation between the gate array 1704 and the MPU 1701. The motor drivers 1706 and 1707 are driven, and the printhead IJH is driven in accordance with the printing data supplied to the head driver 1705, thus performing the printing operation.

Input/output control of the contents of the EEPROM 1708 in the printer having the above arrangement will be described below.

Figure 3:
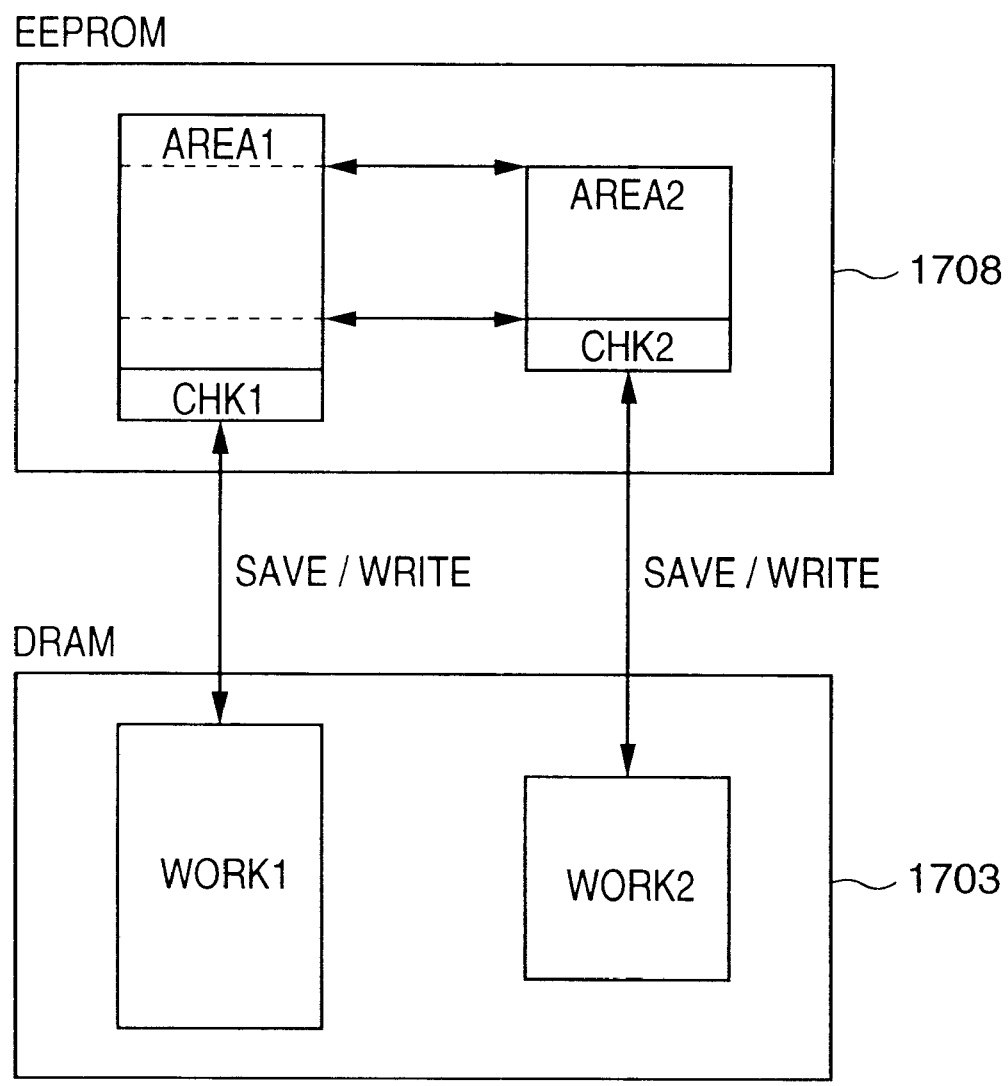
FIG. 3 is a view showing the relationship between the EEPROM internal structure and the DRAM work area.

FIG. 3 is a view showing the relationship between the information storage area of the EEPROM 1708 and the related information storage area of the DRAM 1703.

As shown in FIG. 3, the EEPROM 1708 has the first area (AREA1) and the second area (AREA2) as the information storage area. The EEPROM 1708 also has an area (CHK1) for storing a reference value (TH1) for determining integrity of information in the first area and an area (CHK2) for storing a reference value (TH2) for determining integrity of information in the second area. For example, the sums of data stored in all address of the first and second areas are written as TH1 and TH2 in the areas CHK1 and CHK2, respectively. The sizes of the first and second areas satisfy relation AREA1≧AREA2, and the pieces of information in the first and second areas have redundancy. The second area stores at least some of information stored in the first area. If AREA1=AREA2, all the pieces of information stored in the first area can be set identical to those stored in the second area.

The information stored in at least the second area is desirable minimum information to normally execute the print operation of the printer IJRA. For example, the minimum information need not include information capable of allowing the MPU 1701 to reproduce information by a new print operation upon starting the printer IJRA, e.g., necessary information which can be set again from a host. This will be described in detail below.

Practically, the EEPROM capacity must be minimized to reduce the apparatus cost because the EEPROM is much more expensive than a normal memory device (e.g., a DRAM). In this embodiment, therefore, the quantity of information stored in the second area (AREA2) is set minimum to reduce a memory size required for the EEPROM.

Various pieces of information are required to allow a printer to perform print operations. In this embodiment, information stored in AREA2 is determined depending on whether information losses adversely affect execution of an accurate print operation and maintenance of the apparatus.

In this embodiment, the following information is stored in AREA 2. Examples are (1) print density correction data based on the rank (information defining density characteristics and the like) of a printhead set at the time of shipment from a factory and correction data associated with drive mechanism accuracy (e.g., conveyance accuracy of print paper and scanning accuracy of a carriage), and (2) apparatus maintenance history data such as a cumulative number of printed papers, a cumulative number of recovery operation, a cumulative number of attaching/detaching of a printhead, a suction ink amount in a recovery operation, and a discharge ink amount in a preliminary discharge operation.

The above information is stored in AREA2 for the following reason.

That is, when the information (1) is lost, the drive mechanism operation in the print operation cannot be maintained with high accuracy, and high image print quality cannot be maintained.

When the information (2) is lost, an appropriate maintenance work cannot be performed.

For example, the ink discharged by the recovery or preliminary discharge operation is stored in an ink tank (not shown) incorporating a porous ink absorbing member disposed in the apparatus. An ink discharged exceeding the limited capacity of the ink tank overflows the tank, which may adversely affect the electrical system in the apparatus. Thus, the amount of waste ink stored in the ink tank must be checked in maintenance, and the ink tank must be replaced with the new one in accordance with the checked ink amount. Therefore, when information representing the discharged ink amount is lost, a timing at which the ink tank should be replaced with the new one cannot be known.

The degree of degradation of a conveyance roller and a convey motor provided in the convey mechanism of the apparatus depends on the cumulative number of printed papers. If information representing the cumulative number of printed papers is lost, the appropriate maintenance and replacement timings of the conveyance roller and the conveyance motor cannot be known.

On the other hand, the following information is information which can be set again by the user. Therefore, it is assumed in this embodiment that this information is stored not in AREA2 but in only AREA1.

Examples of this information are registration adjustment data used in correcting a print position error, user setting information associated with the recovery operation (e.g., a recovery timing and a recovery operation execution interval), and user setting information associated with execution control for detecting a remaining ink amount. The registration adjustment data includes data for correcting the print position error when the printhead performs printing in both the forward and backward directions in reciprocal scanning, and data for correcting the position error of each printhead in the subscanning direction (recording medium conveyance direction) in printing operation using a plurality of printheads.

These data are normally set again on the basis of print results upon test printing by the user. Thus, even if these data are lost, if the user attempts to set these data again, they can be recovered and the loss of these data does not critically affect execution of print operations by the apparatus.

When such data is lost, the apparatus may be arranged to automatically execute test printing in the next print operation for the data recovery. Alternatively, an LED lamp arranged on the operation panel (not shown) of the apparatus may be turned on, an alarm message may be displayed on an LCD, or a buzzer may be sounded so as to prompt the user to set information again. In addition, the apparatus may be arranged to transmit information for displaying an alarm message on the display screen of the host 100 through the interface 1700.

The DRAM 1703 has a work area (WORK1) serving as a temporary save area of the information stored in the first area, and a work area (WORK2) serving as a temporary save area of the information stored in the second area.

Figure 4:
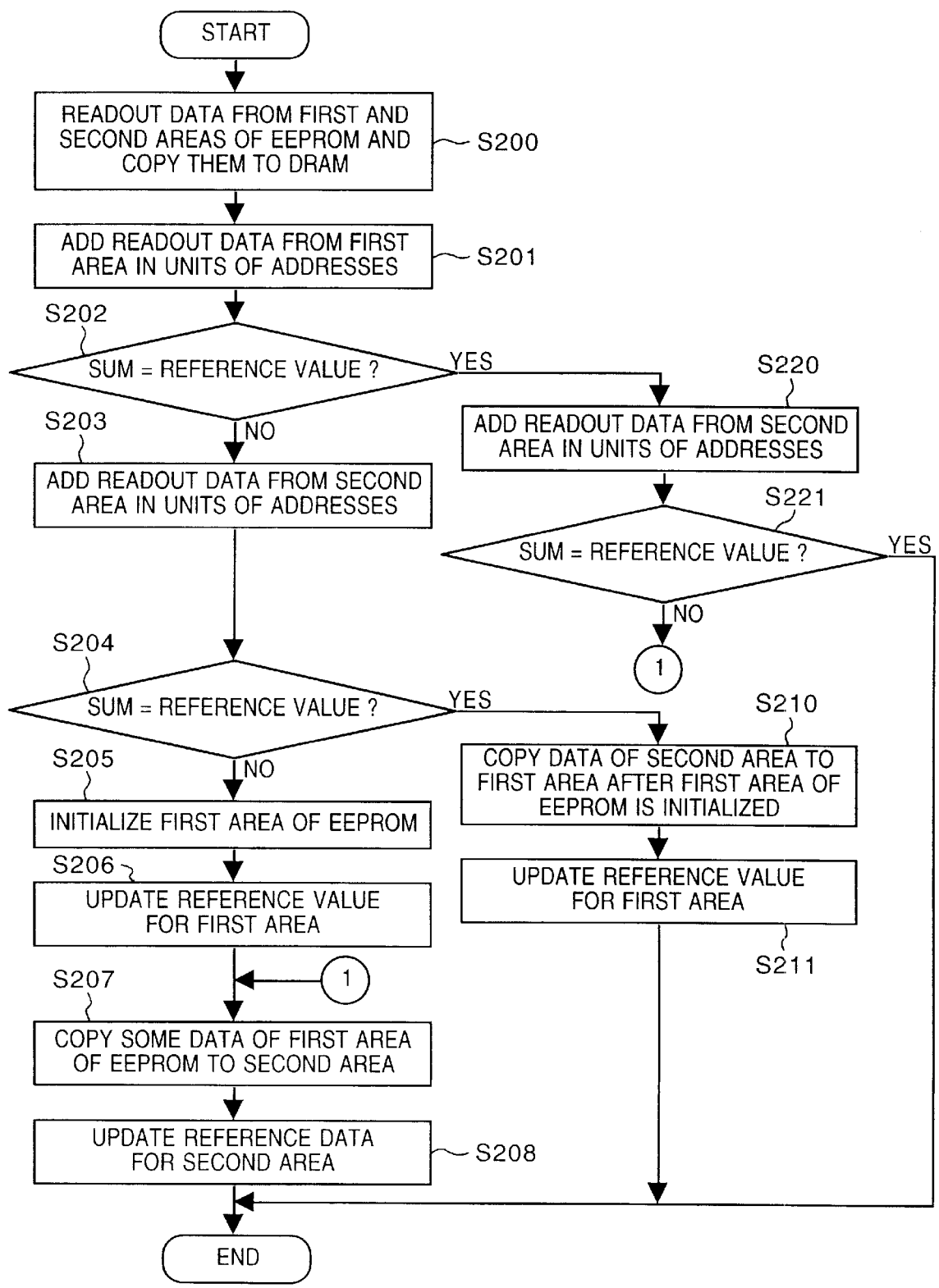
FIG. 4 is a flow chart showing read control for the EEPROM.

Read control for the EEPROM 1708 will be described with reference to the flow chart in FIG. 4. Note that this control is realized when the MPU 1701 executes a control program stored in the ROM 1702.

When the printer IJRA is powered on, the data in the first and second areas of the EEPROM 1708 are read out, and the readout data are copied to WORK1 and WORK2 of the DRAM 1703, respectively, in step S200. In step S201, the data of the first area which have been copied to the DRAM 1703 are added in units of addresses. It is checked in step S202 whether or not the sum (SUM1) is equal to the reference value (TH1).

If SUM1≠TH1, then processing advances to step S203. The data of the second area which have been copied to the DRAM 1703 are added in units of addresses. It is checked in step S204 whether or not the sum (SUM2) is equal to the reference value (TH2). If SUM≠TH2, then processing advances to step S205 to initialize the first area of the EEPROM 1708.

In step S206, the reference value (TH1) for the first area is updated. More specifically, the data of the initialized first area are added in units of addresses, and updating is performed such that the sum is to be used as the reference value (TH1). In step S207, some of the data in the first area of the EEPROM 1708 are copied to the second area. In step S208, the reference value (TH2) for the second area is updated. More specifically, the data of the second area to which some of the data in the first area have been copied are added in units of addresses. Updating is then performed such that the sum is to be used as the reference value (TH2).

On the other hand, if SUM2=TH2 in step S204, then processing advances to step S210 to initialize the first area of the EEPROM 1708 and then copy the data of the second area to the first area. In step S211, the reference value (TH1) for the first area is updated as in step S206.

If SUM1=TH1 in step S202, processing advances to step S220. The data of the second area which have been copied to the DRAM 1703 are added in units of addresses. It is checked in step S221 whether or not the sum (SUM2) is equal to the reference value (TH2). If SUM2≠TH2, then processing advances to step S207; otherwise, it is determined that the contents of the EEPROM 1708 are correctly written. Processing is then ended.

From the above processing, it is determined that:
(1) If SUM1=TH1 and SUM2=TH2, integrity of the data in the EEPROM 1708 is perfectly ensured;
(2) If SUM1=TH1 and SUM2≠TH2, then the data in the second area is not ensured but can be perfectly restored using the data of the first area;
(3) If SUM1≠TH1 and SUM2=TH2, then integrity of the data in the first area are not ensured, but some of these data can be restored using the data of the second area; and
(4) If SUM1≠TH1 and SUM2≠TH2, then integrity of the data in the EEPROM 1708 is no longer ensured.

Execution of a print operation, maintenance, and the like can be subsequently controlled in accordance with the determination results. For example, when case (1) or (2) is determined, control can move to a normal print operation. When case (3) is determined, the MPU 1701 executes a print operation upon regenerating data for the first area. Alternatively, data for the first area is regenerated while executing the print operation. If case (4) is determined, minimum information required for executing a print operation is generated in cooperation with the host, the print operation is started again, and then data for the first and second areas are regenerated.

Note that, in a case where an EEPROM is employed as memory means, an area where information is written at a time is limited. Thus, even though power supply is shut off during writing operation, data integrity in either the first area or the second area is usually ensured. Thus, if an EEPROM is employed as the memory means, the above case (4) occurs particularly when the EEPROM is replaced by a new EEPROM due to the expiry of the lifetime.

Figure 5:
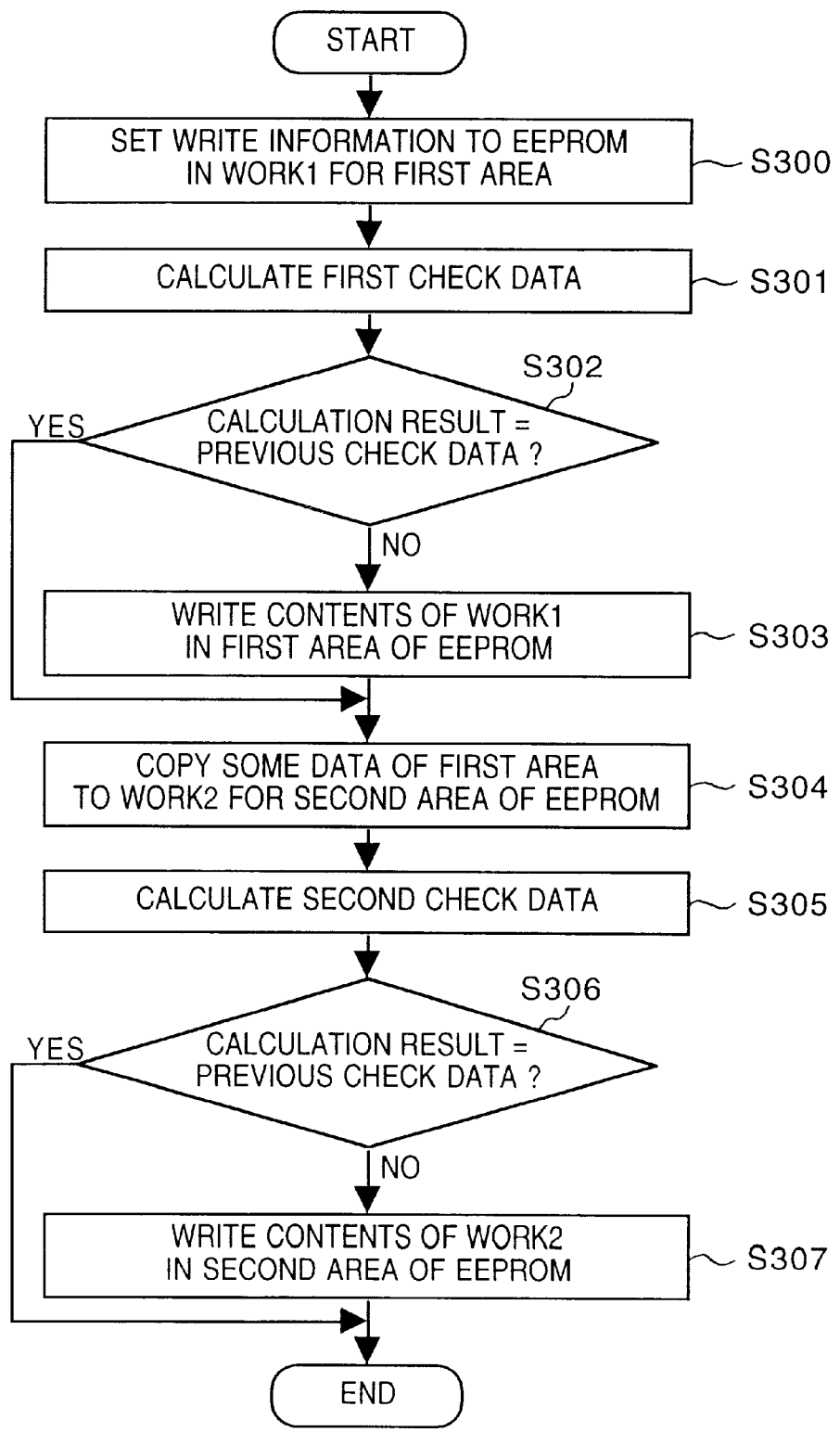
FIG. 5 is a flow chart showing write control for the EEPROM.

Write control for the EEPROM 1708 will be described with reference to the flow chart in FIG. 5. Note that this control can be realized when the MPU 1701 executes a control program stored in the ROM 1702.

In step S300, write information to the EEPROM 1708 is set in WORK1 of the DRAM 1703. In step S301, the reference value (NTH1) for the first area of the EEPROM 1708 is calculated on the basis of the information set in WORK1. In addition, it is checked in step S302 whether or not the calculation result is equal to the previous reference value (OTH1). If NTH1≠OTH1, then processing advances to step S303 to write the contents of WORK1 in the first area of the EEPROM 1708 in order to update the contents of the first area of the EEPROM 1708. At this time, the corresponding reference value is also written.

If NTH1=OTH1, processing advances to step S304.

In step S304, some pieces of the information set in WORK1 are copied to WORK2 of the DRAM 1703. In step S305, the reference value (NTH2) for the second area of the EEPROM 1708 is calculated on the basis of the information copied to WORK2. It is checked in step S306 whether or not the calculation result is equal to the previous reference value (OTH2). If NTH2≠OTH2, then processing advances to step S307 to write the contents of WORK2 in the second area of the EEPROM 1708 in order to update the contents of the second area of the EEPROM 1708. At this time, the corresponding reference value is also written.

If NTH2=OTH2, then processing is ended.

According to the embodiment described above, redundancy is imparted to information when the information is to be written in the EEPROM. At the same time, data capable of checking integrity of the written information is also written. In reading out this information, it can be checked whether or not integrity of the readout information is ensured.

For example, even if power to the printer is accidentally interrupted due to some reason during the write of the information in the EEPROM, and integrity of write information cannot be ensured, integrity of the information can be determined in its read-out. Therefore, the apparatus can be prevented from an operation error when the operation is performed based on information whose integrity is not ensured.

In the above description, the EEPROM is used as a typical example of the non-volatile memory, but it goes without saying that the present invention is applicable to any other non-volatile memory such as an SRAM with a backup battery.

In the above described embodiment, an example in which it is checked whether or not there is abnormality in information stored in a memory when a printer is powered on. This is because a case where integrity on information to be stored can not be ensured often occurs particularly in a non-volatile memory if power supply is shut off during writing operation. However, the timing as to whether or not there is abnormality on the information is checked is not limited to the above described embodiment. For example, this check may be performed periodically, or may be checked when information on history of printing operations and the like is updated.

The above described embodiment has exemplified a printer, which comprises means (e.g., an electrothermal transducer, laser beam generator, and the like) for generating heat energy as energy utilized upon execution of ink discharge, and causes a change in state of an ink by the heat energy, among the ink-jet printers. According to this ink-jet printer and printing method, a high-density, high-precision printing operation can be attained.

As the typical arrangement and principle of the ink-jet printing system, one practiced by use of the basic principle disclosed in, for example, U.S. Pat. Nos. 4,723,129 and 4,740,796 is preferable. The above system is applicable to either one of so-called an on-demand type and a continuous type. Particularly, in the case of the on-demand type, the system is effective because, by applying at least one driving signal, which corresponds to printing information and gives a rapid temperature rise exceeding film boiling, to each of electrothermal transducers arranged in correspondence with a sheet or liquid channels holding a liquid (ink), heat energy is generated by the electrothermal transducer to effect film boiling on the heat acting surface of the printhead, and consequently, a bubble can be formed in the liquid (ink) in one-to-one correspondence with the driving signal. By discharging the liquid (ink) through a discharge opening by growth and shrinkage of the bubble, at least one droplet is formed. If the driving signal is applied as a pulse signal, the growth and shrinkage of the bubble can be attained instantly and adequately to achieve discharge of the liquid (ink) with the particularly high response characteristics.

As the pulse driving signal, signals disclosed in U.S. Pat. Nos. 4,463,359 and 4,345,262 are suitable. Note that further excellent printing can be performed by using the conditions described in U.S. Pat. No. 4,313,124 of the invention which relates to the temperature rise rate of the heat acting surface.

As an arrangement of the printhead, in addition to the arrangement as a combination of discharge nozzles, liquid channels, and electrothermal transducers (linear liquid channels or right angle liquid channels) as disclosed in the above specifications, the arrangement using U.S. Pat. Nos. 4,558,333 and 4,459,600, which disclose the arrangement having a heat acting portion arranged in a flexed region is also included in the present invention. In addition, the present invention can be effectively applied to an arrangement based on Japanese Patent Laid-Open No. 59-123670 which discloses the arrangement using a slot common to a plurality of electrothermal transducers as a discharge portion of the electrothermal transducers, or Japanese Patent Laid-Open No. 59-138461 which discloses the arrangement having an opening for absorbing a pressure wave of heat energy in correspondence with a discharge portion.

Furthermore, as a full line type printhead having a length corresponding to the width of a maximum printing medium which can be printed by the printer, either the arrangement which satisfies the full-line length by combining a plurality of printheads as disclosed in the above specification or the arrangement as a single printhead obtained by forming printheads integrally can be used.

In addition, not only an exchangeable chip type printhead, as described in the above embodiment, which can be electrically connected to the apparatus main unit and can receive an ink from the apparatus main unit upon being mounted on the apparatus main unit but also a cartridge type printhead in which an ink tank is integrally arranged on the printhead itself can be applicable to the present invention.

It is preferable to add recovery means for the printhead, preliminary auxiliary means, and the like provided as an arrangement of the printer of the present invention since the printing operation can be further stabilized. Examples of such means include, for the printhead, capping means, cleaning means, pressurization or suction means, and preliminary heating means using electrothermal transducers, another heating element, or a combination thereof. It is also effective for stable printing to provide a preliminary discharge mode which performs discharge independently of printing.

Furthermore, as a printing mode of the printer, not only a printing mode using only a primary color such as black or the like, but also at least one of a multi-color mode using a plurality of different colors or a full-color mode achieved by color mixing can be implemented in the printer either by using an integrated printhead or by combining a plurality of printheads.

Moreover, in each of the above-mentioned embodiments of the present invention, it is assumed that the ink is a liquid. Alternatively, the present invention may employ an ink which is solid at room temperature or less and softens or liquefies at room temperature, or an ink which liquefies upon application of a use printing signal, since it is a general practice to perform temperature control of the ink itself within a range from 30° C. to 70° C. in the ink-jet system, so that the ink viscosity can fall within a stable discharge range.

In addition, in order to prevent a temperature rise caused by heat energy by positively utilizing it as energy for causing a change in state of the ink from a solid state to a liquid state, or to prevent evaporation of the ink, an ink which is solid in a non-use state and liquefies upon heating may be used. In any case, an ink which liquefies upon application of heat energy according to a printing signal and is discharged in a liquid state, an ink which begins to solidify when it reaches a printing medium, or the like, is applicable to the present invention. In this case, an ink may be situated opposite electrothermal transducers while being held in a liquid or solid state in recess portions of a porous sheet or through holes, as described in Japanese Patent Laid-Open No. 54-56847 or 60-71260. In the present invention, the above-mentioned film boiling system is most effective for the above-mentioned inks.

The present invention can be applied to a system constituted by a plurality of devices (e.g., host computer, interface, reader, printer) or to an apparatus comprising a single device (e.g., copy machine, facsimile).

Further, the object of the present invention can be also achieved by providing a storage medium storing program codes for performing the aforesaid processes to a system or an apparatus, reading the program codes with a computer (e.g., CPU, MPU) of the system or apparatus from the storage medium, then executing the program.

In this case, the program codes read from the storage medium realize the functions according to the embodiment, and the storage medium storing the program codes constitutes the invention.

Further, the storage medium, such as a floppy disk, a hard disk, an optical disk, a magneto-optical disk, CD-ROM, CD-R, a magnetic tape, a non-volatile type memory card, and ROM can be used for providing the program codes.

Furthermore, besides aforesaid functions according to the above embodiment are realized by executing the program codes which are read by a computer, the present invention includes a case where an OS (operating system) or the like working on the computer performs a part or entire processes in accordance with designations of the program codes and realizes functions according to the above embodiment.

Furthermore, the present invention also includes a case where, after the program codes read from the storage medium are written in a function expansion card which is inserted into the computer or in a memory provided in a function expansion unit which is connected to the computer, CPU or the like contained in the function expansion card or unit performs a part or entire process in accordance with designations of the program codes and realizes functions of the above embodiment.

As many apparently widely different embodiments of the present invention can be made without departing from the spirit and scope thereof, it is to be understood that the invention is not limited to the specific embodiments thereof except as defined in the appended claims.

What is claimed is:

1. A printing apparatus for printing on a print medium by a printhead, comprising:
    electrically programmable and erasable first and second memory means;
    control means for writing predetermined first information, which the printing apparatus should store, and first check data capable of determining integrity of the first information into said first memory means, and writing second information constituted by at least a part of the first information and second check data capable of determining integrity of the second information into said second memory means; and
    determination means for reading out the first information and the first check data stored in said first memory means so as to determine the integrity of the first information, and reading out the second information and the second check data stored in said second memory means so as to determine the integrity of the second information,
    wherein said control means performs updating the first information stored in said first memory means and/or the second information stored in said memory means in accordance with the determination result of the integrity of the first and second information by said determination means.

2. The apparatus according to claim 1, wherein said first and second memory means are non-volatile memories, respectively.

3. The apparatus according to claim 1, wherein said first and second memory means are respectively a first area and a second area which are obtained by dividing a storage area of a non-volatile memory.

4. The apparatus according to claim 1, wherein
    said determination means includes comparison means for comparing the first information with the first check data as well as comparing the second information with the second check data, and
    said determination means determines the integrity of the first and second information based on the comparison result by said comparison means.

5. The apparatus according to claim 4, wherein
    said determination means generates first and second reference information used for respectively comparing the first and second check data in accordance with the first and second information, and determines the integrity of the first and second information based on the generated reference data.

6. The apparatus according to claim 5, wherein
    said first and second memory means are respectively addressable memories,
    the first check data is information obtained by adding data stored in each address of said first memory means in which the first information is stored under the condition that the integrity of the first information is ensured,
    the first reference data to be compared with the first check data is information obtained by adding data stored in each address of said first memory means in which the first information is stored,
    the second check data is information obtained by adding data stored in each address of said second memory means in which the second information is stored under the condition that the integrity of the second information is ensured, and
    the second reference data to be compared with the second check data is information obtained by adding data stored in each address of said second memory means in which the second information is stored.

7. The apparatus according to claim 1, wherein, in a case where it is determined by said determination means that neither the integrity of the first information written in said first memory means nor the integrity of the second information written in said second memory means is ensured, said control means rewrites the first information stored in said first memory means by initial setting information of the printing apparatus, rewrites the second information stored in said second memory means according to the rewritten first information, and updates the first and second check data.

8. The apparatus according to claim 1, wherein, in a case where it is determined by said determination means that the integrity of the first information written in said first memory means is not ensured and the integrity of the second information written in said second memory means is ensured, said control means rewrites the first information stored in said first memory means according to the second information stored in said second memory means and updates the first check data.

9. The apparatus according to claim 1, wherein, in a case where it is determined by said determination means that the integrity of the second information written in said second memory means is not ensured and the integrity of the first information written in said first memory means is ensured, said control means rewrites the second information stored in said second memory means according to the first information stored in said first memory means and updates the second check data.

10. The printing apparatus according to claim 1, wherein said control means causes said determination means to make a determination according to power-on to the printing apparatus, and said control means performs rewriting operation on the first information stored in said first memory means and/or the second information stored in said second information in accordance with the determination result by said determination means.

11. The printing apparatus according to claim 1, wherein said printhead is a printhead for discharging ink to perform a print operation according to an ink-jet printing method.

12. The printing apparatus according to claim 11, wherein said printhead comprises an electrothermal transducer for applying heat energy to the ink so as to discharge the ink using the heat energy.

13. The printing apparatus according to claim 1, wherein the second information written in said second memory means is information indispensable to holding of accuracy of a print operation of said printing apparatus and maintenance of said printing apparatus.

14. The printing apparatus according to claim 13, wherein the second information written in said second memory means includes print density correction data set at the time of shipment from a factory, correction data associated with drive mechanism accuracy of said printing apparatus, a cumulative number of printed paper, a cumulative number of recovery operation, a cumulative number of attaching/detaching of a printhead, a suction ink amount in a recovery operation, and a discharge ink amount in a preliminary discharge operation.

15. A method of protecting information in a printing apparatus, including electrically programmable and erasable first and second memory means, for printing on a print medium by a printhead, comprising:

a first write-in step of writing predetermined first information, which the printing apparatus should store, and first check data capable of determining integrity of the first information into the first memory means;

a second write-in step of writing second information constituted by at least a part of the first information and second check data capable of determining integrity of the second information into the second memory means;

a determination step of reading out the first information and the first check data stored in the first memory means so as to determine the integrity of the first information, and reading out the second information and the second check data stored in the second memory means so as to determine the integrity of the second information;

a rewrite step of rewriting the first information stored in the first memory means and/or the second information stored in the second memory means in accordance with the determination result of the integrity of the first and second information at said determination step.

16. The method according to claim 15, wherein the first and second memory means are non-volatile memories, respectively.

17. The method according to claim 15, wherein the first and second memory means are respectively a first area and a second area which are obtained by dividing a storage area of a non-volatile memory.

18. The method according to claim 15, wherein, in a case where it is determined at said determination step that neither the integrity of the first information written in the first memory means nor the integrity of the second information written in the second memory means is ensured, said rewrite step rewrites the first information stored in the first memory means by initial setting information of the printing apparatus, rewrites the second information stored in the second memory means according to the rewritten first information, and updates the first and second check data.

19. The method according to claim 1, wherein, in a case where it is determined at said determination step that the integrity of the first information written in the first memory means is not ensured and the integrity of the second information written in the second memory means is ensured, said rewrite step rewrites the first information stored in the first memory means according to the second information stored in the second memory means and updates the first check data.

20. The method according to claim 15, wherein, in a case where it is determined at said determination step that the integrity of the second information written in the second memory means is not ensured and the integrity of the first information written in the first memory means is ensured, said rewrite step rewrites the second information stored in the second memory means according to the first information stored in the first memory means and updates the second check data.

21. The method according to claim 15, wherein said determination step to make a determination is performed according to power-on to the printing apparatus, and said rewrite step is performed in accordance with the determination result at said determination step.

22. The method according to claim 15, wherein said printhead is a printhead for discharging ink to perform a print operation according to an ink-jet printing method.

23. The method according to claim 22, wherein said printhead comprises an electrothermal transducer for applying heat energy to the ink so as to discharge the ink using the heat energy.

* * * * *

UNITED STATES PATENT AND TRADEMARK OFFICE
CERTIFICATE OF CORRECTION

PATENT NO. : 6,002,846

DATED : December 14, 1999

INVENTOR(S) : HIDEAKI OKAMOTO

It is certified that error appears in the above-identified patent and that said Letters Patent is hereby corrected as shown below:

[73] ASSIGNEE

"Canon Kabushiki Kaisha, Japan" should read
--Canon Kabushiki Kaisha, Tokyo, Japan--.

[56] REFERENCES CITED

Foreign Patent Documents
"62230370" should read --62-230370--.

COLUMN 3

Line 50, "is" should read --are--.
Line 53, "is" should read --are--.

COLUMN 6

Line 6, "relation" should read --the relation--.
Line 45, "reason." should read --reasons.--.

UNITED STATES PATENT AND TRADEMARK OFFICE
CERTIFICATE OF CORRECTION

PATENT NO. : 6,002,846

DATED : December 14, 1999

INVENTOR(S) : HIDEAKI OKAMOTO

It is certified that error appears in the above-identified patent and that said Letters Patent is hereby corrected as shown below:

COLUMN 14

Line 5, "information;" should read --information; and--.

Signed and Sealed this

Tenth Day of October, 2000

Attest:

Q. TODD DICKINSON

*Attesting Officer*　　　*Director of Patents and Trademarks*